United States Patent
Tu et al.

(10) Patent No.: US 11,259,118 B2
(45) Date of Patent: Feb. 22, 2022

(54) SIGNAL PROCESSING APPARATUS, SIGNAL PROCESSING METHOD AND NON-TRANSITORY COMPUTER-READABLE RECORDING MEDIUM

(71) Applicant: Acer Incorporated, New Taipei (TW)

(72) Inventors: Po-Jen Tu, New Taipei (TW); Jia-Ren Chang, New Taipei (TW); Kai-Meng Tzeng, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 148 days.

(21) Appl. No.: 16/589,313

(22) Filed: Oct. 1, 2019

(65) Prior Publication Data

US 2020/0404418 A1 Dec. 24, 2020

(30) Foreign Application Priority Data

Jun. 21, 2019 (TW) .................................. 108121713

(51) Int. Cl.
G06F 17/00 (2019.01)
H04R 3/04 (2006.01)
G10L 25/51 (2013.01)

(52) U.S. Cl.
CPC ................ H04R 3/04 (2013.01); G10L 25/51 (2013.01)

(58) Field of Classification Search
CPC .................................. H04R 3/04; G10L 25/51
USPC .......................................................... 700/94
See application file for complete search history.

(56) References Cited

U.S. PATENT DOCUMENTS

| | | | | |
|---|---|---|---|---|
| 8,605,380 B1* | 12/2013 | Christensen | ..... | G11B 20/10009 360/65 |
| 8,671,128 B1* | 3/2014 | Dehghan | ............ | H04B 1/71057 708/323 |
| 2003/0076844 A1* | 4/2003 | Usman | ............... | H03H 21/0012 370/401 |
| 2003/0200243 A1* | 10/2003 | Yomo | ................ | H03H 17/0283 708/306 |
| 2004/0078403 A1* | 4/2004 | Scheuermann | .... | H03H 17/0294 708/322 |

(Continued)

OTHER PUBLICATIONS

Finite Impulse Response Wikipedia entry available at least Aug. 17, 2018 (Year: 2018).*

(Continued)

*Primary Examiner* — Paul C McCord
(74) *Attorney, Agent, or Firm* — Edell, Shapiro & Finnan LLC

(57) ABSTRACT

A Finite Impulse Response (FIR) filter is configured to minimize delay and maximize passband power by adjusting the filter coefficients applied to the sampled values. The FIR filter obtains an input signal and samples the input signal to generate a set of sampled input values. The FIR filter generates a set of filter coefficients, with each filter coefficient based on a corresponding sampled input value in the set of sample input values. The FIR filter selects a subset of sampled input values that have been most recently sampled from the input signal, and selects a subset of filter coefficients corresponding to sampled input values that are not the most recently sampled. The subset of sampled input values is combined with the subset of filter coefficients to generate an output value for the FIR filter.

17 Claims, 4 Drawing Sheets

(56) References Cited

U.S. PATENT DOCUMENTS

| | | | |
|---|---|---|---|
| 2005/0099907 A1* | 5/2005 | Sawada | G11B 20/10009 369/47.26 |
| 2007/0052556 A1* | 3/2007 | Janssen | H03H 17/0294 341/50 |
| 2009/0198754 A1* | 8/2009 | Chang | H03H 21/0012 708/319 |
| 2009/0319065 A1* | 12/2009 | Risbo | G11B 20/10527 700/94 |
| 2010/0228806 A1* | 9/2010 | Streicher | G06F 7/5324 708/203 |
| 2013/0128374 A1* | 5/2013 | Christensen | G11B 20/10509 360/40 |
| 2015/0236669 A1* | 8/2015 | Mehrnia | H03H 17/0219 708/208 |
| 2016/0019929 A1* | 1/2016 | Hutchins | G11B 20/10046 360/65 |
| 2018/0226953 A1* | 8/2018 | Kang | H03H 17/06 |
| 2019/0080035 A1* | 3/2019 | Guo | G06F 30/36 |

OTHER PUBLICATIONS

FIR transfer function Wikipedia entry available at least Jun. 20, 2019 (Year: 2019).*

* cited by examiner

SIGNAL PROCESSING APPARATUS, SIGNAL PROCESSING METHOD AND NON-TRANSITORY COMPUTER-READABLE RECORDING MEDIUM

This application claims the benefit of Taiwan Application Serial No. 108121713, filed Jun. 21, 2019, the subject matter of which is incorporated herein by reference.

TECHNICAL FIELD

The disclosure relates to a Finite Impulse Response (FIR) filtering technique. In particular, the disclosure relates to a signal processing apparatus, a signal processing method, and a non-transitory computer-readable recording medium for an FIR filter.

BACKGROUND

In typical audio signal processing techniques, equalizer (EQ) parameters are first tuned to balance the sound field of the stereo channels. The adjusted signal is then provided to the sound processing module (e.g., Dolby or DTS). In order to provide a suitable signal to the sound processing module, an FIR filter is often used to tune the EQ parameters to obtain a stable signal without distortion.

FIR filters may achieve better results under special conditions. For instance, an FIR filter with the power of the filtered signal within the passband having the same as the power of the input signal may experience improved frequency selectivity. If there is no signal outside of the passband, then the power should be negative infinity ($-\infty$ dBFS (decibels relative to Full Scale)) for an ideal FIR filter. In traditional FIR filter applications, increasing the power within the passband and minimizing the power outside of the passband typically leads to a longer delay time. If the delay time of audio is larger than 10 milliseconds (ms), some users may perceive the delay in the audio signal. However, the sound processing module typically requires more than a 5 ms delay time. The techniques presented herein maintain the power within the passband of an FIR filter while reducing the delay time of the FIR filter.

BRIEF DESCRIPTION OF THE DRAWINGS

Embodiments are described herein in conjunction with the accompanying drawings, in which.

DESCRIPTION OF EXAMPLE EMBODIMENTS

Figure 1:
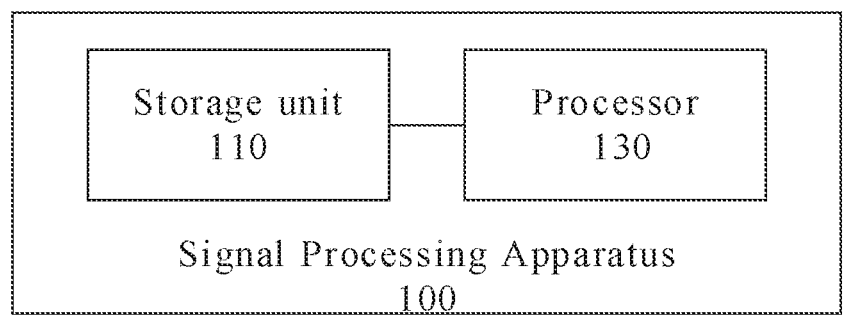
FIG. 1 is a block diagram for the components of a signal processing apparatus according to an example embodiment.

FIG. 1 is a block diagram for the components of a signal processing apparatus 100 according to an embodiment of the present invention. Referring to FIG. 1, the signal processing apparatus 100 includes at least a storage unit 110 and a processor 130, but may include additional components. The signal processing apparatus 100 may be a computer system, an audio system, a smart speaker, a smart TV, an amplifier, an equalizer, or other computing device configured to process signals.

The processor 130 is coupled to the storage unit 110, and the processor 130 may be, for example, a central processing unit (CPU) or other programmable microprocessor for general purpose or special purpose, a digital signal processor (DSP), a programmable controller, an Application Specific Integrated Circuit (ASIC), or other similar components or a combination of the above components. In an embodiment described herein, the processor 130 implements the operations of the signal processing apparatus 100, and may load and implement software modules, files, and/or data recorded from the storage unit 110. In one example, the processor 130 may implement an FIR filter through software operation or through a filtered circuit, e.g., a circuit composed of one or more adders, shifters, and/or multipliers. In another example, the processor 130 may be coupled to a separate FIR filtered circuit, e.g., a circuit comprising one or more adders, shifters, and/or multipliers. The processor 130 may be configured to determine coefficients used by the filtered circuit and sample points of the input signal.

Figure 2:
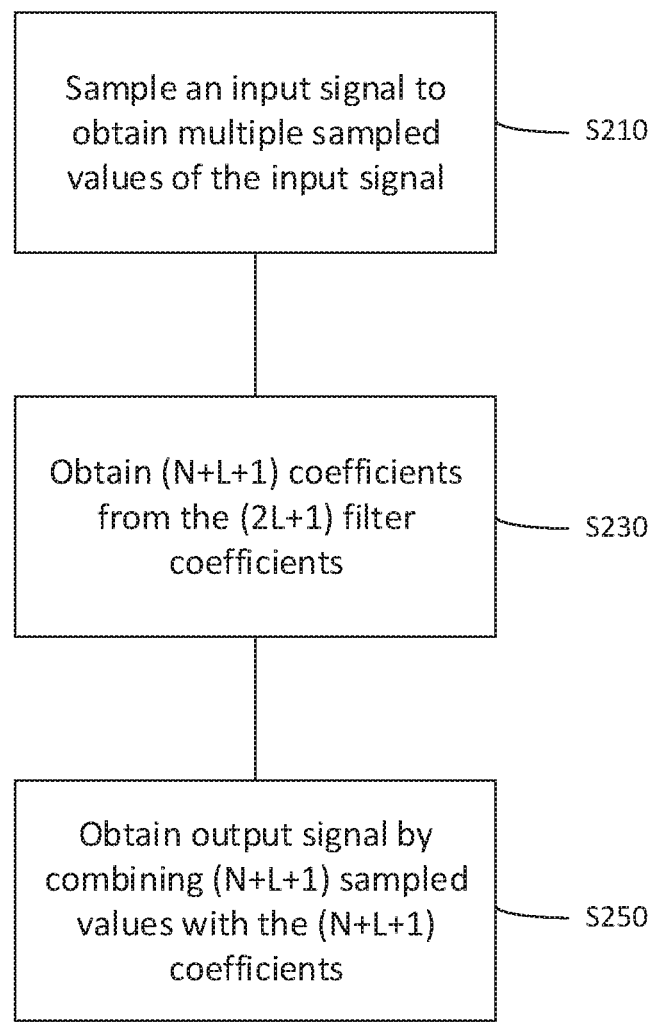
FIG. 2 is a flow chart for a signal processing method according to an example embodiment.

FIG. 2 is a flow chart for a signal processing method according to an example embodiment. Referring to FIG. 2, the processor 130 obtains the input signal from the storage unit 110, and the input signal is sampled to obtain multiple sampled values of the input signal at step S210. In one example, the processor 130 samples N+L+1 values of the input signal at the nth time point. These sampled points correspond to the current sampled point (i.e., the nth point) and the past N+L sampled points based on the nth time point. In this example, n, L, and N are each positive integers, with N<L. These sampled values of the input signal can be expressed in mathematical form as:

$$\vec{x} = \{x[n]x[n-1] \ldots x[n-N-L]\}, \quad (1)$$

where x[n] is a sampled value of the input signal (assumed to be x(t), with t as a time index). In equation (1), x[n] corresponds to the nth sampled point, and x[n−1] is a sampled value of the input signal x(t) corresponding to the previously sampled time point, i.e., the sampled value of the input signal x(t−1). Similarly, x[n−N−L] is a sampled value of the input signal x(t) corresponding to the time point sampled N+L time points ago. In other words, there are (N+L) sampled points between the current sampled value x[n] and the oldest sampled value x[n−N−L]. The (N+L+1) sampled values may be formed as a vector of the input signal $\vec{x}$. It should be noted that the selection of the numerical values of L and N will be explained hereinafter. Furthermore, the input signal may be an audio signal, an image signal or other types of signals.

At step S230, the processor 130 obtains (N+L+1) filter coefficients from (2L+1) filter coefficients. Using a typical FIR filter technique, increasing the number of sampled points would maintain the power of the signal within the passband, but the delay time of the filter would increase. Conversely, reducing the delay time of a traditional FIR filter would reduce the power of the signal within the passband.

For instance, sampling 2N+1 points from the input signal $x_1(t)$, where t is a time index, obtains a vector $\vec{x}_1$ of the sampled input values from t=n back to t=n−2N−1, which may be expressed in mathematical form as:

$$\vec{x}_1 = \{x_1[n]x_1[n-1] \ldots x_1[n-2N]\}. \quad (2)$$

Based on the frequency for the FIR filter, taking the $N^{th}$ sampled point as the center point, 2N+1 filter coefficients $b_1$ may be obtained, which are symmetrically distributed on either side of the center point. The filter coefficients may be expressed in mathematical form as:

$$\vec{b}_1 = \{b_1[0] \ldots b_1[N] \ldots b_1[2N]\} \quad (3)$$

Taking the inner product of the vectors $\vec{x}_1$ and $\vec{b}_1$ (i.e., using the filter coefficients $\vec{b}_1$ to filter the sampled input signal $\vec{x}_1$, or performing a weighting operation based on the filter coefficients $\vec{b}_1$) generates an output signal $y_1[n-N]$ which delays the input signal $x_1$ by N time points.

Figure 3:
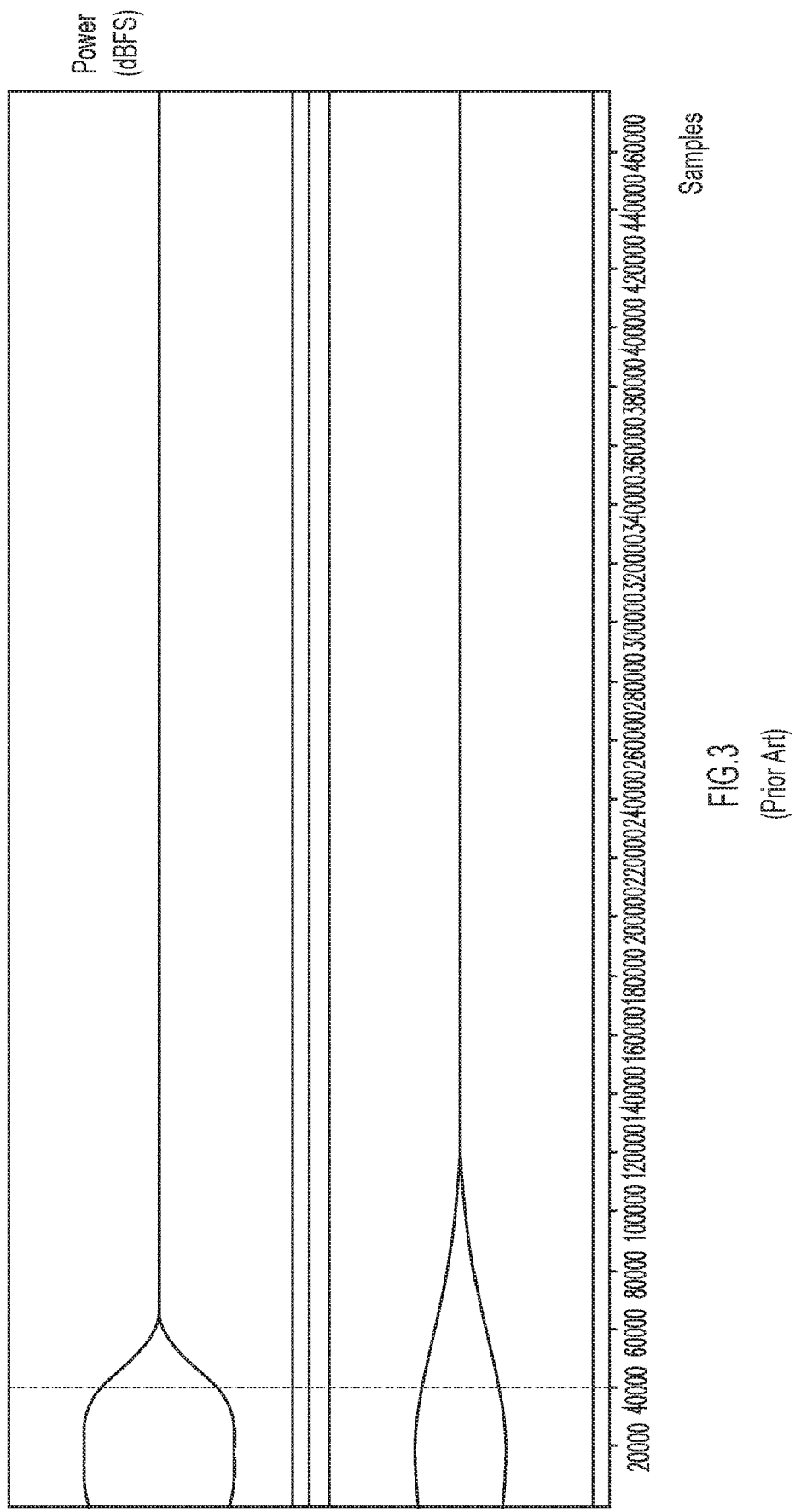
FIG. 3 is a sampled-power graph of traditional FIR filters.
Figure 4:
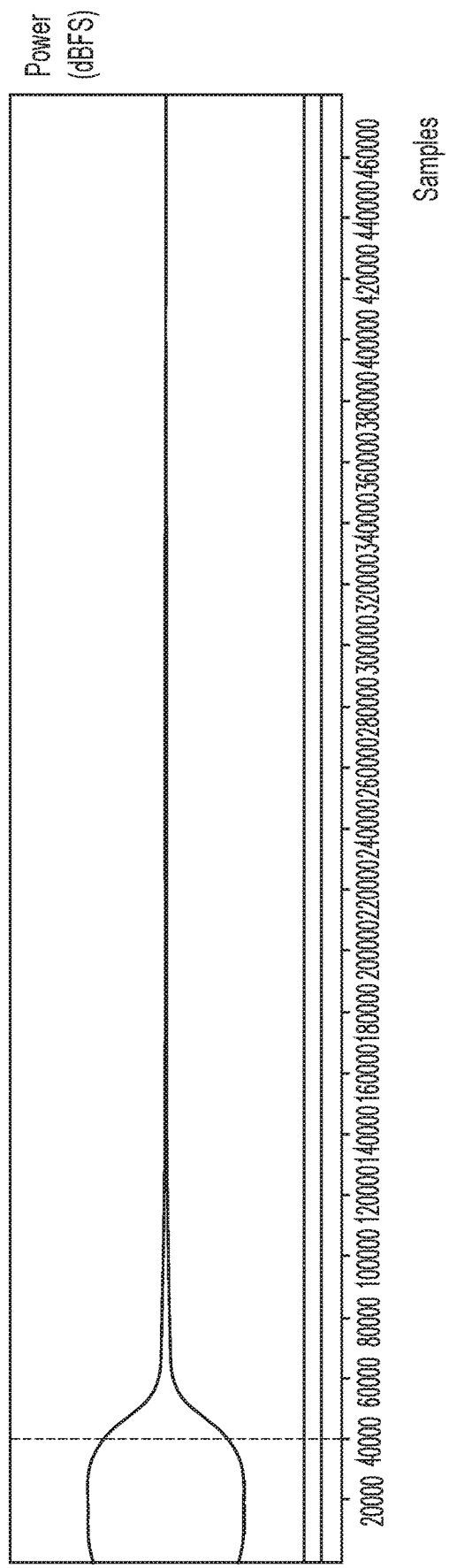
FIG. 4 is a sampled-power graph of a FIR filter according to an example embodiment.

FIG. 3 is a sampled-power graph using traditional FIR filters. In the graphs of FIG. 3 and FIG. 4 the input signal to the FIR filter is a swept sine signal with the power −6 dBFS and the frequencies swept from 1000 Hz to 3000 Hz. The FIR filter is designed with a passband between 945 Hz and 1,190 Hz, such that the cutoff frequency 1,190 Hz is close to the 40,000th sampled point, and the sampled points before the 40,000th point are the signal within the passband. Referring to the top graph in FIG. 3, the delay length N is set to 4M=480 (i.e., the delay time is 480 divided by the sampling rate), leading the total number of sampled points to be 961 (i.e., 2*(4M)+1). In this example, the output power within the passband is close to the original signal, which is −6.19 dBFS. The length of transition band (e.g., samples positioned between 40,000-67,000 sampled points) is short, the power of the transition band is −16 dBFS, and the power within the stopband (e.g., sampled points above 67,000) is −65 dBFS.

Referring to the lower graph in FIG. 3, the delay length N is set to M=120, leading the total number of sampled points to be 241 (i.e., 2M+1). In this example of a typical FIR filter, the power within the passband is only −10.17 dBFS. The length of transition band is longer (e.g., samples positioned between 40,000-130,000 sampled points), the power of the transition band is −21 dBFS. For convenience of comparison, the transition band of the FIR filter characterized in the lower portion of FIG. 3 can be divided into two parts: a first part between samples 40,000-67,000 with a power of −14 dBFS, and a second part between samples 67,000-130,000 with a power of −28 dBFS. Furthermore, the power within the stopband (e.g., sampled points above 130,000) is −65 dBFS.

In order to maintain N sampled points for the delay length and improve the power of the signal within the passband (e.g., by including approximately 8N+1 total sampled points), the FIR filter described herein makes the following improvements. Referring back to FIG. 2, in step S210, the processor 130 extends the number of sampled points L, e.g., by setting L=7N such that the value of L is larger than N. The value of L determines the expected power of the filtered output signal. In one example, the processor 130 may determine the value of L by setting a specific power threshold (e.g., 0.3 dB, 0.5 dB, or 1 dB, etc.) which is the difference between the expected power of the output signal and the input signal within the passband. It should be noted that L may also be set to be 8N, or other values. With a larger value of L, the filtered result is closer to the ideal condition, i.e., the power of the output signal is close to or equal to the power of the input signal within the passband. However, the computational burden of the FIR filter increases with larger values of L.

Furthermore, the processor 130 provides an FIR filter of order 2L with 2L+1 filter coefficients, which are taking the $L^{th}$ sampled point as the center point and the other filter coefficients symmetrically distributed on either side of the center point. In other words, there are L filter coefficients on either side of the center point. Depending on the requirements, the filter coefficients may be designed based on high-pass, low-pass, or specific passband filters, and the function of the invention is not limited to any of these pass characteristics. The filter coefficients may be expressed in mathematical form as:

$$\vec{b}_o = \{b[0] \ldots b[L] \ldots b[2L]\} \quad (4)$$

In other words, these filter coefficients were originally designed for the (2L+1) sampled points of the input signal. Therein, the first filter coefficient b[0] is a sample value for a currently sampled point, and the second filter coefficient b[1] is a sample value for an immediately prior sampled point. And so on, the $(2L+1)^{th}$ filter coefficient b[2L] is a sample value for 2L time points before the currently sampled point. However, as shown in FIG. 3, too many sampled points will increase the delay time. Using (2L+1) filter coefficients increases the delay length to L (i.e., significantly longer than N).

In order to maintain the delay length at N samples, the processor 130 takes only a subset of filter coefficients out of the 2L+1 filter coefficients. In one example, the processor selects filter coefficients from the $(L-N+1)^{th}$ filter coefficient to the $(2L+1)^{th}$ filter coefficient (i.e., the rear N+L+1 filter coefficients). These N+L+1 filter coefficients may be expressed in mathematical form as:

$$\vec{b} = \{b[L-N] \ldots b[L] \ldots b[2L]\} \quad (5)$$

The $(L-N+1)^{th}$ filter coefficient is b[L−N], and the $(L+1)^{th}$ filter coefficient is b[L], and so on, with the $(2L+1)^{th}$ filter coefficient being b[2L]. In other words, using the $(L+1)^{th}$ sampled point (b[L]) as the center point, there are N coefficients on one side and L coefficients on the other side. It should be noted that the processor 130 may select other sections of filter coefficients in other embodiments. For instance, the processor 130 may select filter coefficients b[L−2N] to b[2L−N] or b[L−N−5] to b[2L−N−5] in order to generate the output signal with the latest L+N+1 sampled values of the input signal. The total number of sampled points L+N+1 is between 2L+1 and 2N+1 in FIG. 3, but the delay length is still kept to N. It should be noted that the value of N can be determined based on the delay time, for example, 2.5 ms, 5 ms, or 6 ms, based on the sampling rate. In particular, a delay time of less than 10 ms is not easily perceived by human ears.

In step S250, the processor 130 computes an output signal based on the selected N+L+1 filter coefficients with the N+L+1 sampled values obtained in step S210. In particular, the processor 130 may take the inner product of the vectors $\vec{x}$ and $\vec{b}$ (i.e., a convolution operation). This inner product may generate an output signal y[n−N] which delays the output signal by N time points from the input signal. The output signal may be expressed in mathematical form as:

$$y[n-N] = b[L-N]x[n] + b[L-N+1]x[n-1] + \ldots + b[2L]x[n-N-L] \quad (6)$$

In another example, the processor 130 may be coupled to an additional filter circuit. The processor 130 provides the determined coefficients (e.g., {b[L−N] b[L−N+1] b[2L]}) to the coupled filtered circuit. The additional filter circuit may then filter the input signal based on the determined coefficients. Furthermore, the output signal can be subject to further sound processed or playback, e.g., through a speaker.

FIG. 4 is a sampled-power graph using the FIR filter described herein. The same input signal as used in FIG. 3, i.e., a swept sine signal with the power −6 dBFS with the frequencies swept from 1000 Hz to 3000 Hz, is processed by a FIR filter/circuit tuned to the same passband as shown in FIG. 3 (i.e., between 945 Hz and 1,190 Hz). The cutoff frequency 1,190 Hz of the FIR filter is close to the 40,000th sampled point (i.e., the sampled points below 40,000 are the signal within the passband). Referring to FIG. 4, the delay length N is set to 120 and the total number of sampled points is 961 (i.e., 8N+1). In this example, the power within the passband is −6.3 dBFS. For convenience of comparison, the transition band may be divided into three parts including a first part comprising the sampled points between 40,000-67,000 with a power of −18 dBFS. The power in the first part of the transition band is lower than the same range of sampled points of the traditional FIR filters shown in FIG. 3. The second part of the transition band includes sampled points between 67,000-130,000 with a power of −31 dBFS. The power in the second part of the transition is lower when compared to the power in the same range of sampled points for the traditional FIR filter with the same delay length as shown in the bottom of FIG. 3. The third part of the transition band includes the sampled points above 130,000 with a power of −43 dBFS, which is higher than the traditional FIR filters, but is still an acceptably low power level.

Table 1 compares the power of traditional FIR filters with the FIR filter described herein in different sampling/frequency bands. As shown in Table 1, the power within the passband of the FIR filter described herein is close to the original input signal. Although the FIR filter described herein has a very long transition band (more than 3000 Hz), the total power is not very large. Notably, the power in the first part of the transition band is attenuated the most. The power in the second part is attenuated more than the traditional FIR filter with the same delay length. Although the power in the third part is the highest for the FIR filter described herein, the power in the third part is 30 dB lower than the power within the passband. As human ears cannot easily perceive audio signals at this low power level, the power performance may be acceptable.

TABLE 1

| | Below 40,000 | 40,000-67,000 | 67,000-130,000 | Above 130,000 |
|---|---|---|---|---|
| FIR filter described herein: the number of sampled points (N + L + 1) is 961 and the delay length N is 120 | −6.3 dBFS | −18 dBFS | −31 dBFS | −43 dBFS |
| Traditional: the number of sampled points (2N + 1) is 241 and the delay length N is 120 | −10.17 dBFS | −14 dBFS | −28 dBFS | −65 dBFS |
| Traditional: the number of sampled points (2L + 1) is 961 and the delay length (L = 4N) is 480 | −6.19 dBFS | −16 dBFS | −65 dBFS | −65 dBFS |

In summary, a signal processing apparatus, a signal processing method, and a non-transitory computer-readable recording medium described herein provide for an improved FIR filter. The techniques described herein take a subset of the sampled values of the input signal and combine them with a subset of L+N+1 filter coefficients, which are obtained from the set of 2L+1 filter coefficients. Thus, the delay length is kept to N, and the power of the output signal within the passband remains close to or equal to the power of the input signal.

The above description is intended by way of example only.

What is claimed is:

1. A method comprising:
    obtaining an input signal at a signal processor;
    sampling the input signal at a sampling rate to generate a set of sampled input values, the set of sampled input values including a number 2L+1 of sampled input values;
    generating a set of filter coefficients for a Finite Impulse Response (FIR) filter of order 2L, wherein each of the filter coefficients is based on a corresponding sampled input value in the set of sampled input values;
    setting a delay time equal to a number N divided by the sampling rate, wherein the number N is less than a number L, from which the number 2L+1 is derived, and wherein the number L determines an expected power of an output value for the FIR filter;
    selecting a subset of sampled input values from the set of sampled input values, the subset of sampled input values including a number N+L+1 of sampled input values that have been most recently sampled;
    selecting a subset of filter coefficients from the set of filter coefficients, the subset of filter coefficients including the number N+L+1 of filter coefficients corresponding to sampled input values that are not most recently sampled; and
    combining the subset of sampled input values with the subset of filter coefficients to generate the output value for the FIR filter, the output value for the FIR filter being delayed from the input signal by an amount of time equal to the delay time.

2. The method of claim 1, wherein selecting the subset of filter coefficients selects the number N+L+1 of filter coefficients, the subset of filter coefficients comprising N+L+1 filter coefficients corresponding to sampled input values that are least recently sampled in the set of sampled input values.

3. The method of claim 1, wherein the number N+L+1 of sampled input values is at least eight times the number N.

4. The method of claim 1, wherein the number N is selected such that the delay time is less than 10 milliseconds.

5. The method of claim 1, wherein combining the subset of sampled input values with the subset of filter coefficients comprises taking an inner product of a sampled input vector and a filter coefficient vector, the sampled input vector having components equal to the selected subset of sampled input values, and the filter coefficient vector having components equal to the selected subset of filter coefficients.

6. The method of claim 1, wherein combining the subset of sampled input values with the subset of filter coefficients comprises providing the subset of filter coefficients to a separate FIR filter circuit.

7. A signal processing apparatus comprising:
    a memory to store sampled input values and filter coefficients; and
    a processor configured to:
        obtain an input signal;
        sample the input signal at a sampling rate to generate a set of the sampled input values, the set of sampled input values including a number 2L+1 of sampled input values;
        generate a set of the filter coefficients for a Finite Impulse Response (FIR) filter of order 2L, wherein each of the filter coefficients is based on a corresponding sampled input value in the set of sampled input values;

set a delay time equal to a number N divided by the sampling rate, wherein the number N is less than a number L, from which the number 2L+1 is derived, and wherein the number L determines an expected power of an output value for the FIR filter;

select a subset of sampled input values from the set of sampled input values, the subset of sampled input values including a number N+L+1 of sampled input values that have been most recently sampled;

select a subset of filter coefficients from the set of filter coefficients, the subset of filter coefficients including the number N+L+1 of filter coefficients corresponding to sampled input values that are not most recently sampled; and combine the subset of sampled input values with the subset of filter coefficients to generate the output value for the FIR filter, the output value for the FIR filter being delayed from the input signal by an amount of time equal to the delay time.

8. The signal processing apparatus of claim 7, wherein the processor is configured to select the subset of filter coefficients by selecting the number N+L+1 of filter coefficients, the subset of filter coefficients comprising N+L+1 filter coefficients corresponding to sampled input values that are least recently sampled in the set of sampled input values.

9. The signal processing apparatus of claim 7, wherein the processor is configured to select the number N+L+1 of sampled input values to be at least eight times the number N.

10. The signal processing apparatus of claim 7, wherein the processor is configured to select the number N such that the delay time is less than 10 milliseconds.

11. The signal processing apparatus of claim 7, wherein the processor is configured to combine the subset of sampled input values with the subset of filter coefficients by taking an inner product of a sampled input vector and a filter coefficient vector, the sampled input vector having components equal to the selected subset of sampled input values, and the filter coefficient vector having components equal to the selected subset of filter coefficients.

12. The signal processing apparatus of claim 7, wherein the processor is configured to combine the subset of sampled input values with the subset of filter coefficients by providing the subset of filter coefficients to a separate FIR filter circuit.

13. One or more non-transitory computer readable recording media encoded with instructions that, when executed by a processor of a computing device, cause the processor to:

obtain an input signal;

sample the input signal at a sampling rate to generate a set of sampled input values, the set of sampled input values including a number 2L+1 of sampled input values;

generate a set of filter coefficients for a Finite Impulse Response (FIR) filter of order 2L, wherein each of the filter coefficients is based on a corresponding sampled input value in the set of sampled input values;

set a delay time equal to a number N divided by the sampling rate, wherein the number N is less than a number L, from which the number 2L+1 is derived, and wherein the number L determines an expected power of an output value for the FIR filter;

select a subset of sampled input values from the set of sampled input values, the subset of sampled input values including a number N+L+1 of sampled input values that have been most recently sampled;

select a subset of filter coefficients from the set of filter coefficients, the subset of filter coefficients including the number N+L+1 of filter coefficients corresponding to sampled input values that are not most recently sampled; and combine the subset of sampled input values with the subset of filter coefficients to generate the output value for the FIR filter, the output value for the FIR filter being delayed from the input signal by an amount of time equal to the delay time.

14. The non-transitory computer readable recording media of claim 13, further comprising instructions operable to cause the processor to select the subset of filter coefficients by selecting the number N+L+1 of filter coefficients, the subset of filter coefficients comprising N+L+1 filter coefficients corresponding to sampled input values that are least recently sampled in the set of sampled input values.

15. The non-transitory computer readable recording media of claim 13, further comprising instructions operable to cause the processor to select the number N+L+1 of sampled input values to be at least eight times the number N.

16. The non-transitory computer readable recording media of claim 13, further comprising instructions operable to cause the processor to select the number N such that the delay time is less than 10 milliseconds.

17. The non-transitory computer readable recording media of claim 13, further comprising instructions operable to cause the processor to combine the subset of sampled input values with the subset of filter coefficients by taking an inner product of a sampled input vector and a filter coefficient vector, the sampled input vector having components equal to the selected subset of sampled input values, and the filter coefficient vector having components equal to the selected subset of filter coefficients.

* * * * *